(12) United States Patent
Masuda

(10) Patent No.: US 9,030,273 B2
(45) Date of Patent: May 12, 2015

(54) ELECTRONIC COMPONENT

(71) Applicant: Murata Manufacturing Co., Ltd., Nagaokakyo-shi, Kyoto-fu (JP)

(72) Inventor: Hiroshi Masuda, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 88 days.

(21) Appl. No.: 13/871,194

(22) Filed: Apr. 26, 2013

(65) Prior Publication Data

US 2014/0145798 A1 May 29, 2014

Related U.S. Application Data

(63) Continuation of application No. PCT/JP2011/075466, filed on Nov. 4, 2011.

(30) Foreign Application Priority Data

Nov. 19, 2010 (JP) .................................. 2010-259191

(51) Int. Cl.
*H03H 7/09* (2006.01)
*H03H 7/01* (2006.01)
*H03H 1/00* (2006.01)

(52) U.S. Cl.
CPC .............. *H03H 7/0115* (2013.01); *H03H 7/09* (2013.01); *H03H 7/1775* (2013.01); *H03H 2001/0085* (2013.01)

(58) Field of Classification Search
CPC ................. H03H 7/0115; H03H 7/09; H03H 2001/0085; H03H 7/1775
USPC .................................................. 333/175, 185
See application file for complete search history.

(56) References Cited

U.S. PATENT DOCUMENTS

2006/0261914 A1* 11/2006 Moriai et al. ................. 333/185
2007/0241839 A1 10/2007 Taniguchi (Continued)

FOREIGN PATENT DOCUMENTS

JP 2004-104588 A 4/2004
JP 2007-325047 A 12/2007

(Continued)

OTHER PUBLICATIONS

Official Communication issued in International Patent Application No. PCT/JP2011/075466, mailed on Dec. 13, 2011.

*Primary Examiner* — Benny Lee
*Assistant Examiner* — Rakesh Patel
(74) *Attorney, Agent, or Firm* — Keating & Bennett, LLP

(57) ABSTRACT

An electronic component includes a multilayer body including insulating layers that are stacked on each other. First and second LC parallel resonators each include via hole conductors extending in a z-axis direction and loop shaped conductive layers provided on the insulating layers. The first and second LC parallel resonators define a band pass filter. A first loop plane of the first LC parallel resonator and a second loop plane of the second LC parallel resonator are parallel or substantially parallel to the z-axis direction, are parallel or substantially parallel to each other, and are overlapped with each other at at least a portion of the first loop plane and the second loop plane in a plan view from the direction perpendicular or substantially perpendicular to the first loop plane. The first loop plane protrudes from the second loop plane at the positive direction in the z-axis direction.

18 Claims, 6 Drawing Sheets

(56) References Cited

U.S. PATENT DOCUMENTS

2010/0171568 A1* 7/2010 Taniguchi ............ 333/176
2010/0283557 A1   11/2010 Taniguchi
2011/0037536 A1*  2/2011 Kanno et al. ............ 333/185

FOREIGN PATENT DOCUMENTS

| WO | 2007/119356 A1 | 10/2007 |
|----|----------------|---------|
| WO | 2009/142113 A1 | 11/2009 |

* cited by examiner

ELECTRONIC COMPONENT

BACKGROUND OF THE INVENTION

1. Field of the Invention

The present invention relates to electronic components. More particularly, the present invention relates to an electronic component including a band pass filter that includes a plurality of LC parallel resonators.

2. Description of the Related Art

For example, a known multilayer band pass filter is described in International Publication No. 2007/119356 as an electronic component in the related art. The multilayer band pass filter includes a multilayer body and multiple LC parallel resonators. The multilayer body includes multiple dielectric layers that are stacked on each other. Each LC parallel resonator includes a capacitor electrode and an inductor electrode. The inductor electrode is formed in a loop shape. Loop planes of the respective LC parallel resonators are overlapped with each other. Since the loop planes are overlapped with each other in the multilayer band pass filter described above, it is possible to increase the degree of coupling between the inductor electrodes of adjacent LC parallel resonators to widen the bandwidth of the multilayer band pass filter.

In such an electronic component including the band pass filter including multiple LC parallel resonators, there are cases in which the degree of coupling between the inductor electrodes of the LC parallel resonators needs to be reduced in order to achieve desired characteristics. An exemplary method of reducing the degree of coupling between adjacent LC parallel resonators in the multilayer band pass filter described in International Publication No. 2007/119356 is to increase the distance between the LC parallel resonators. However, the increase in the distance between the LC parallel resonators may cause a problem in that the multilayer band pass filter is increased in size.

SUMMARY OF THE INVENTION

Preferred embodiments of the present invention provide an electronic component in which the degree of coupling between coils of LC parallel resonators is significantly reduced without increasing the size of the electronic component.

An electronic component according to a preferred embodiment of the present invention includes a multilayer body including a plurality of insulating layers that are stacked on each other, and a first LC parallel resonator and a second LC parallel resonator that each include via hole conductors extending in a stacking direction and conductive layers provided on the insulating layers and that each have a loop shape. The first LC parallel resonator and the second LC parallel resonator define a band pass filter. A first loop plane of the first LC parallel resonator and a second loop plane of the second LC parallel resonator are parallel or substantially parallel to the stacking direction, are parallel or substantially parallel to each other, and are overlapped with each other at at least a portion of the first loop plane and the second loop plane in a plan view from a direction perpendicular or substantially perpendicular to the first loop plane. The first loop plane protrudes from the second loop plane at an upper side and/or a lower side of the stacking direction.

According to various preferred embodiments of the present invention, it is possible to adjust the degree of coupling between the coils of the LC parallel resonators without increasing the size of the electronic component.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Electronic components according to preferred embodiments of the present invention will herein be described.

Figure 1:
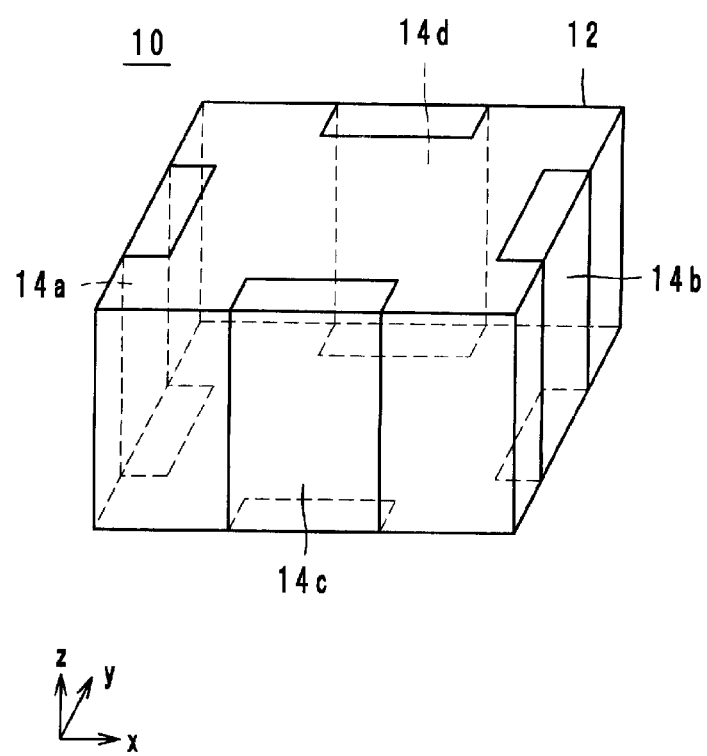
FIG. 1 is an external perspective view of an electronic component according to a preferred embodiment of the present invention.
Figure 2:
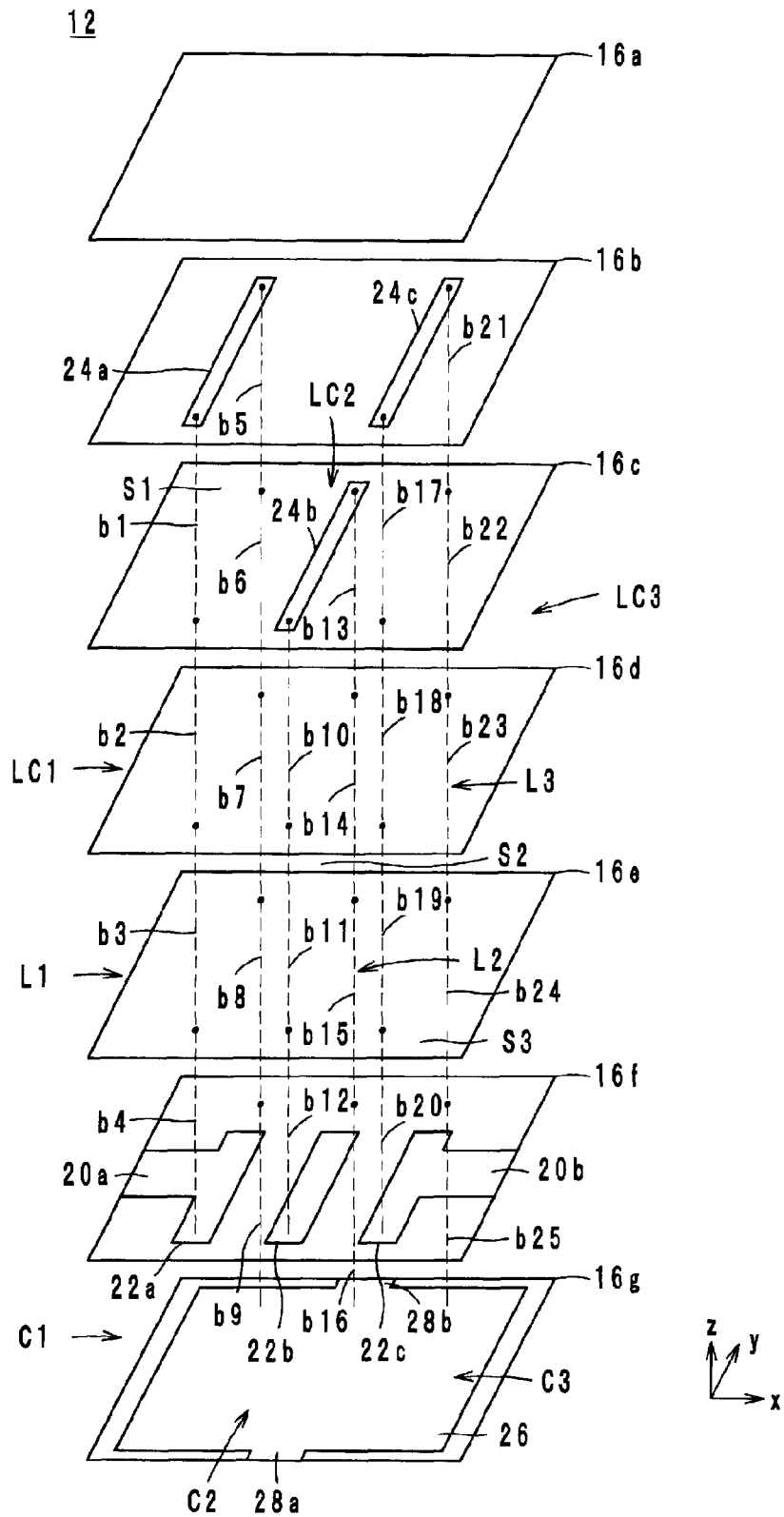
FIG. 2 is an exploded perspective view of a multilayer body of the electronic component.
Figure 3:
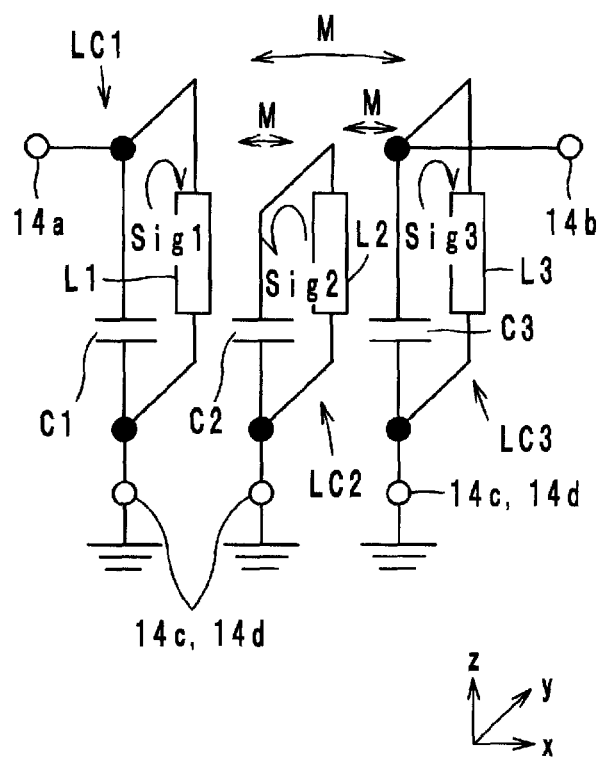
FIG. 3 is an equivalent circuit diagram of the electronic component.
Figure 4:
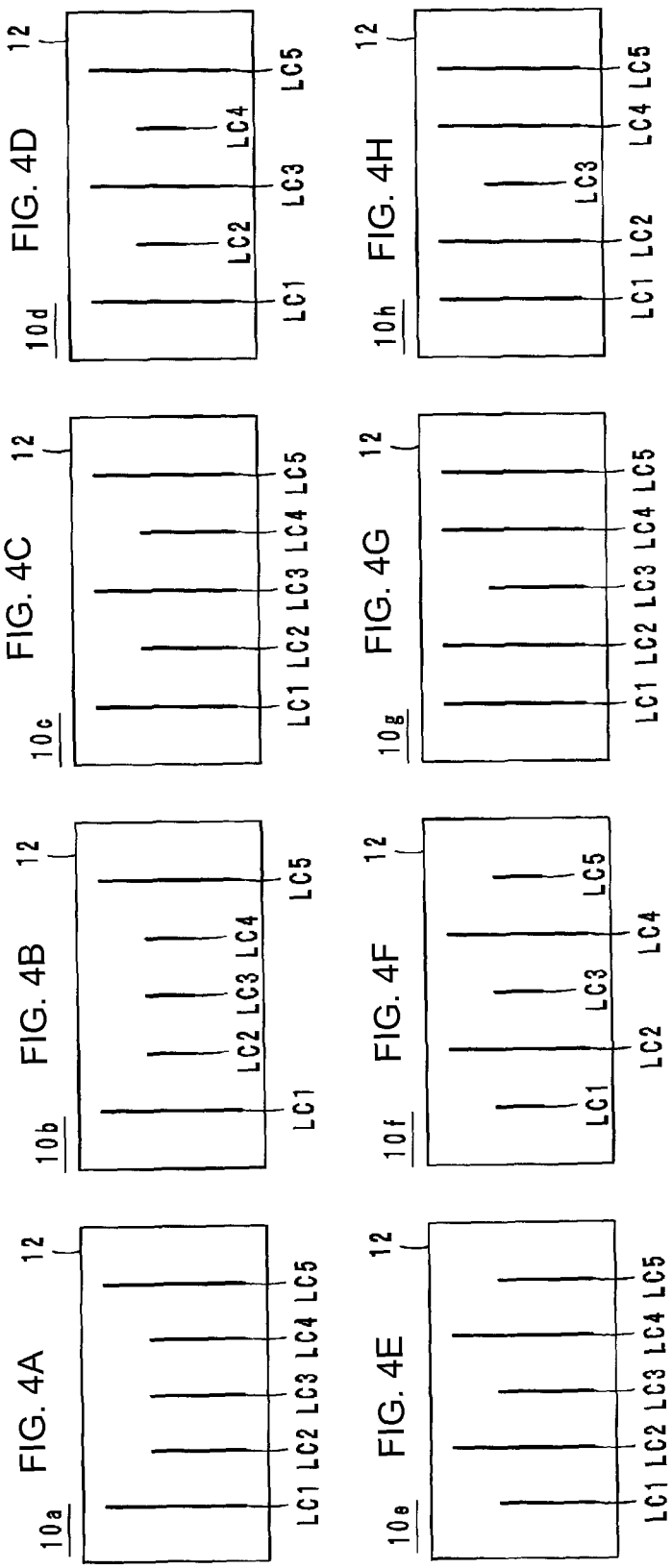
FIG. 4A to FIG. 4H are cross-sectional views illustrating the structures of an electronic component according to first to eighth modifications of a preferred embodiment of the present invention.

The configuration of an electronic component according to a preferred embodiment of the present invention will now be described with reference to the drawings. FIG. 1 is an external perspective view of an electronic component according to the present preferred embodiment of the present invention. FIG. 2 is an exploded perspective view of a multilayer body 12 of the electronic component 10. FIG. 3 is an equivalent circuit diagram of the electronic component 10. Referring to FIG. 1 and FIG. 2, the z-axis direction indicates a stacking direction. The x-axis direction indicates the direction along the long sides of the electronic component and the y-axis direction indicates the direction along the short sides of the electronic component 10.

As illustrated in FIG. 1 and FIG. 2, the electronic component 10 includes the multilayer body 12, outer electrodes 14a to 14d (collectively referred to as an outer electrode 14), LC parallel resonators LC1 to LC3, extended conductive layers 20a and 20b (collectively referred to as an extended conductive layer 20), and extended conductive layers 28a and 28b (collectively referred to as an extended conductive layer 28).

As illustrated in FIG. 2, the multilayer body 12 includes insulating layers 16a to 16g (collectively referred to as an insulating layer 16) which are preferably made of ceramic dielectric bodies, for example, and which are stacked on each other. The multilayer body 12 preferably has a rectangular or substantially rectangular parallelepiped shape, for example. The multilayer body 12 includes the LC parallel resonators LC1 to LC3.

As illustrated in FIG. 1, the outer electrode 14a is provided on a side surface at the negative direction side in the x-axis direction and is used as an input electrode. The outer electrode 14b is provided on a side surface at the positive direction side in the x-axis direction and is used as an output electrode. The outer electrode 14c is provided on a side surface at the negative direction side in the y-axis direction and is used as a ground electrode. The outer electrode 14d is provided on a side surface at the positive direction side in the y-axis direction and is used as a ground electrode.

As illustrated in FIG. 2, the insulating layer 16 preferably has a rectangular or substantially rectangular shape and is made of, for example, a ceramic dielectric body. The insulating layers 16a to 16g are stacked so that the insulating layers 16a to 16g are arranged in this order in the z-axis direction. A surface at the positive direction side in the z-axis direction of the insulating layer 16 is hereinafter referred to as a front surface and a surface at the negative direction side in the z-axis direction of the insulating layer 16 is hereinafter referred to as a rear surface.

The LC parallel resonator LC1 includes a coil L1 and a capacitor C1. More specifically, the LC parallel resonator LC1 includes via hole conductors b1 to b9, a capacitor conductive layer 22a, a coil conductive layer 24a, and a ground conductive layer 26 and is configured to have a loop shape.

The capacitor C1 includes the capacitor conductive layer 22a and the ground conductive layer 26. The ground conductive layer 26 is provided at the side of the most negative direction in the z-axis direction of the LC parallel resonator LC1 and is provided on the front surface of the insulating layer 16g. The ground conductive layer 26 preferably has a rectangular or substantially rectangular shape and substantially the entire surface of the insulating layer 16g is covered with the ground conductive layer 26. The capacitor conductive layer 22a opposes the ground conductive layer 26 via the insulating layer 16f and is provided on the front surface of the insulating layer 16f. The above-described configuration produces electrostatic capacitance between the capacitor conductive layer 22a and the ground conductive layer 26. The capacitor conductive layer 22a preferably has a rectangular or substantially rectangular shape with a longitudinal direction extending in the y-axis direction. The capacitor conductive layer 22a is provided at the negative direction side in the x-axis direction with respect to the intersection of the diagonals of the insulating layer 16f.

The coil L1 includes the via hole conductors b1 to b9 and the coil conductive layer 24a. The via hole conductors b1 to b4 pass through the insulating layers 16b to 16e, respectively, in the z-axis direction. An end portion at the negative direction side in the z-axis direction of the via hole conductor b4 is connected to the capacitor conductive layer 22a. Accordingly, the via hole conductors b1 to b4 are connected to the capacitor conductive layer 22a and define one via hole conductor that extends in the z-axis direction. The via hole conductors b5 to b9 pass through the insulating layers 16b to 16f, respectively, in the z-axis direction and are provided at the positive direction side in the y-axis direction with respect to the via hole conductors b1 to b4. An end portion at the negative direction side in the z-axis direction of the via hole conductor b9 is connected to the ground conductive layer 26. Accordingly, the via hole conductors b5 to b9 are connected to the ground conductive layer 26 and define one via hole conductor that extends in the z-axis direction.

The coil conductive layer 24a is provided at the side of the most positive direction in the z-axis direction of the LC parallel resonator LC1 and is provided on the front surface of the insulating layer 16b. The coil conductive layer 24a preferably has a rectangular or substantially rectangular shape and a longitudinal direction extending in the y-axis direction. The coil conductive layer 24a is provided at the negative direction side in the x-axis direction with respect to the intersection of the diagonals of the insulating layer 16b. The coil conductive layer 24a is connected to an end portion at the positive direction side in the z-axis direction of the one via hole conductor including the via hole conductors b1 to b4 and an end portion at the positive direction side in the z-axis direction of the one via hole conductor including the via hole conductors b5 to b9. In other words, the end portion at the positive direction side in the z-axis direction of the via hole conductor b1 is connected to an end portion at the negative direction side in the y-axis direction of the coil conductive layer 24a. The end portion at the positive direction side in the z-axis direction of the via hole conductor b5 is connected to an end portion at the positive direction side in the y-axis direction of the coil conductive layer 24a.

As described above, the coil L1 preferably has a U shape, for example, one end of which is disposed at the connection point between the via hole conductor b4 and the capacitor conductive layer 22a, which extends through the via hole conductors b1 to b4, the coil conductive layer 24a, and the via hole conductors b5 to b9, and the other end of which is disposed at the via hole conductor b9 and the ground conductive layer 26.

The LC parallel resonator LC1 having the configuration described above defines a loop plane S1 parallel or substantially parallel to the y-z plane. The loop plane S1 is a virtual rectangular plane defined by the LC parallel resonator LC1.

The LC parallel resonator LC2 includes a coil L2 and a capacitor C2. More specifically, the LC parallel resonator LC2 includes via hole conductors b10 to b16, a capacitor conductive layer 22b, a coil conductive layer 24b, and the ground conductive layer 26 and is arranged in a loop shape.

The capacitor C2 includes the capacitor conductive layer 22b and the ground conductive layer 26. The ground conductive layer 26 is provided at the side of the most negative direction in the z-axis direction of the LC parallel resonator LC2 and is provided on the front surface of the insulating layer 16g. The ground conductive layer 26 preferably has a rectangular or substantially rectangular shape and substantially the entire surface of the insulating layer 16g is covered with the ground conductive layer 26. In other words, the ground conductive layer 26 of the capacitor C2 is common to the ground conductive layer 26 of the capacitor C1 and is provided on the front surface of the same insulating layer 16g. The capacitor conductive layer 22b opposes the ground conductive layer 26 via the insulating layer 16f and is provided on the front surface of the insulating layer 16f. The above configuration produces electrostatic capacitance between the capacitor conductive layer 22b and the ground conductive layer 26. The capacitor conductive layer 22b preferably has a rectangular or substantially rectangular shape and a longitudinal direction extending in the y-axis direction. The capacitor conductive layer 22b is provided on the intersection of the diagonals of the insulating layer 16f.

The coil L2 includes the via hole conductors b10 to b16 and the coil conductive layer 24b. The via hole conductors b10 to b12 pass through the insulating layers 16c to 16e, respectively, in the z-axis direction. An end portion at the negative direction side in the z-axis direction of the via hole conductor b12 is connected to the capacitor conductive layer 22b. Accordingly, the via hole conductors b10 to b12 are connected to the capacitor conductive layer 22b and define one via hole conductor that extends in the z-axis direction. The via hole conductors b13 to b16 pass through the insulating layers 16c to 16f, respectively, in the z-axis direction and are provided at the positive direction side in the y-axis direction with respect to the via hole conductors b10 to b12. An end portion at the negative direction side in the z-axis direction of the via hole conductor b16 is connected to the ground conductive layer 26. Accordingly, the via hole conductors b13 to b16 are connected to the ground conductive layer 26 and define one via hole conductor that extends in the z-axis direction.

The coil conductive layer 24b is provided at the side of the most positive direction in the z-axis direction of the LC parallel resonator LC2 and is provided on the front surface of the insulating layer 16c. The coil conductive layer 24b preferably has a rectangular or substantially rectangular shape and a longitudinal direction extending in the y-axis direction. The coil conductive layer 24b is provided on the intersection of the diagonals of the insulating layer 16c. The coil conductive layer 24b is connected to an end portion at the positive direction side in the z-axis direction of the one via hole conductor including the via hole conductors b10 to b12 and an end portion at the positive direction side in the z-axis direction of the one via hole conductor including the via hole conductors b13 to b16. In other words, the end portion at the positive direction side in the z-axis direction of the via hole conductor b10 is connected to an end portion at the negative direction side in the y-axis direction of the coil conductive layer 24b. The end portion at the positive direction side in the z-axis direction of the via hole conductor b13 is connected to an end portion at the positive direction side in the y-axis direction of the coil conductive layer 24b.

As described above, the coil L2 is preferably configured to have a U shape, for example, one end of which is disposed at the connection point between the via hole conductor b12 and the capacitor conductive layer 22b, which extends through the via hole conductors b10 to b12, the coil conductive layer 24b, and the via hole conductors b13 to b16, and the other end of which is disposed at the via hole conductor b16 and the ground conductive layer 26.

The LC parallel resonator LC2 having the configuration described above defines a loop plane S2 parallel or substantially parallel to the y-z plane. The loop plane S2 is a virtual rectangular plane defined by the LC parallel resonator LC2.

The LC parallel resonator LC3 includes a coil L3 and a capacitor C3. More specifically, the LC parallel resonator LC3 includes via hole conductors b17 to b25, a capacitor conductive layer 22c, a coil conductive layer 24c, and the ground conductive layer 26 and is configured to have a loop shape.

The capacitor C3 includes the capacitor conductive layer 22c and the ground conductive layer 26. The ground conductive layer 26 is provided at the side of the most negative direction in the z-axis direction of the LC parallel resonator LC3 and is provided on the front surface of the insulating layer 16g. The ground conductive layer 26 preferably has a rectangular or substantially rectangular shape and substantially the entire surface of the insulating layer 16g is covered with the ground conductive layer 26. In other words, the ground conductive layer 26 of the capacitor C3 is common to the ground conductive layer 26 of the capacitor C1 and the ground conductive layer 26 of the capacitor C2, and is provided on the front surface of the same insulating layer 16g. The capacitor conductive layer 22c opposes the ground conductive layer 26 via the insulating layer 16f and is provided on the front surface of the insulating layer 16f. The above configuration produces electrostatic capacitance between the capacitor conductive layer 22c and the ground conductive layer 26. The capacitor conductive layer 22c preferably has a rectangular or substantially rectangular shape and a longitudinal direction in the y-axis direction. The capacitor conductive layer 22c is provided at the positive direction side in the x-axis direction with respect to the intersection of the diagonals of the insulating layer 16f.

The coil L3 includes the via hole conductors b17 to b25 and the coil conductive layer 24c. The via hole conductors b17 to b20 pass through the insulating layers 16b to 16e, respectively, in the z-axis direction. An end portion at the negative direction side in the z-axis direction of the via hole conductor b20 is connected to the capacitor conductive layer 22c. Accordingly, the via hole conductors b17 to b20 are connected to the capacitor conductive layer 22c and define one via hole conductor that extends in the z-axis direction. The via hole conductors b21 to b25 pass through the insulating layers 16b to 16f, respectively, in the z-axis direction and are provided at the positive direction side in the y-axis direction with respect to the via hole conductors b17 to b20. An end portion at the negative direction side in the z-axis direction of the via hole conductor b25 is connected to the ground conductive layer 26. Accordingly, the via hole conductors b21 to b25 are connected to the ground conductive layer 26 and define one via hole conductor that extends in the z-axis direction.

The coil conductive layer 24c is provided at the side of the most positive direction in the z-axis direction of the LC parallel resonator LC3 and is provided on the front surface of the insulating layer 16b. The coil conductive layer 24c preferably has a rectangular or substantially rectangular shape and a longitudinal direction in the y-axis direction. The coil conductive layer 24c is provided at the positive direction side in the x-axis direction with respect to the intersection of the diagonals of the insulating layer 16b. The coil conductive layer 24c is connected to an end portion at the positive direction side in the z-axis direction of the one via hole conductor including the via hole conductors b17 to b20 and an end portion at the positive direction side in the z-axis direction of the one via hole conductor including the via hole conductors b21 to b25. In other words, the end portion at the positive direction side in the z-axis direction of the via hole conductor b17 is connected to an end portion at the negative direction side in the y-axis direction of the coil conductive layer 24c. The end portion at the positive direction side in the z-axis direction of the via hole conductor b21 is connected to an end portion at the positive direction side in the y-axis direction of the coil conductive layer 24c.

As described above, the coil L3 is preferably configured to have a U shape, for example, one end of which is disposed at the connection point between the via hole conductor b20 and the capacitor conductive layer 22c, which extends through the via hole conductors b17 to b20, the coil conductive layer 24c, and the via hole conductors b21 to b25, and the other end of which is disposed at the via hole conductor b25 and the ground conductive layer 26.

The LC parallel resonator LC3 having the configuration described above defines a loop plane S3 parallel or substantially parallel to the y-z plane. The loop plane S3 is a virtual rectangular plane defined by the LC parallel resonator LC3.

The loop planes S1 to S3 of the LC parallel resonators LC1 to LC3, respectively, are parallel or substantially parallel to the y-z plane (that is, are parallel or substantially parallel to the z-axis direction and are parallel or substantially parallel to each other) and are overlapped with each other at at least a portion of the loop planes S1 to S3 in a plan view from the x-axis direction (that is, from the direction perpendicular or substantially perpendicular to the loop planes S1 to S3). The loop plane S2 is sandwiched between the loop plane S1 and the loop plane S3. As a result, as illustrated in FIG. 3, the coil L1 of the LC parallel resonator LC1 is electromagnetically coupled to the coil L2 of the LC parallel resonator LC2. In addition, the coil L2 of the LC parallel resonator LC2 is electromagnetically coupled to the coil L3 of the LC parallel resonator LC3.

The coil conductive layers 24a and 24c provided at the side of the most positive direction in the z-axis direction in the LC parallel resonators LC1 and LC3, respectively, are provided on the front surface of the insulating layer 16b, which is provided at the positive direction side in the z-axis direction with respect to the coil conductive layer 24b provided at the side of the most positive direction in the z-axis direction in the LC parallel resonator LC2. Accordingly, the loop planes S1 and S3 protrude from the loop plane S2 at the positive direction side in the z-axis direction. Consequently, a portion of the loop plane S1 of the LC parallel resonator LC1 opposes a portion of the loop plane S3 of the LC parallel resonator LC3. As a result, the coil L1 is electromagnetically coupled to the coil L3. The LC parallel resonators LC1 to LC3 configured in the above-described manner define a band pass filter.

The extended conductive layer 20a is provided on the front surface of the insulating layer 16f. The extended conductive layer 20a is connected to the capacitor conductive layer 22a and extends to the short side at the negative direction side in the x-axis direction of the insulating layer 16f. Accordingly, the extended conductive layer 20a is connected to the outer electrode 14a. As a result, the LC parallel resonator LC1 is electrically connected to the outer electrode 14a between the capacitor C1 and the coil L1.

The extended conductive layer 20b is provided on the front surface of the insulating layer 16f. The extended conductive layer 20b is connected to the capacitor conductive layer 22c and extends to the short side at the positive direction side in the x-axis direction of the insulating layer 16f. Accordingly, the extended conductive layer 20b is connected to the outer electrode 14b. As a result, the LC parallel resonator LC3 is electrically connected to the outer electrode 14b between the capacitor C3 and the coil L3.

The extended conductive layer 28a is provided on the front surface of the insulating layer 16g. The extended conductive layer 28a is connected to the ground conductive layer 26 and extends to the long side at the negative direction side in the y-axis direction of the insulating layer 16g. Accordingly, the extended conductive layer 28a is connected to the outer electrode 14c. As a result, the LC parallel resonators LC1 to LC3 are electrically connected to the outer electrode 14c between the capacitors C1 to C3 and the coils L1 to L3, respectively.

The extended conductive layer 28b is provided on the front surface of the insulating layer 16g. The extended conductive layer 28b is connected to the ground conductive layer 26 and extends to the long side at the positive direction side in the y-axis direction of the insulating layer 16g. Accordingly, the extended conductive layer 28b is connected to the outer electrode 14d. As a result, the LC parallel resonators LC1 to LC3 are electrically connected to the outer electrode 14d between the capacitors C1 to C3 and the coils L1 to L3, respectively.

An exemplary operation of the electronic component 10 will now be described with reference to FIG. 1 to FIG. 3. First, a high-frequency signal Sig1 that is input through the outer electrode 14a and that has positive voltage flows clockwise in a plan view from the positive direction side in the x-axis direction, as illustrated in FIG. 3.

The coil L1 is electromagnetically coupled to the coil L2. Accordingly, when the high-frequency signal Sig1 flows clockwise in the LC parallel resonator LC1 in a plan view from the positive direction side in the x-axis direction, a high-frequency signal Sig2 flows counterclockwise in the LC parallel resonator LC2 by electromagnetic induction in a plan view from the positive direction side in the x-axis direction.

The coil L2 is electromagnetically coupled to the coil L3. Accordingly, when the high-frequency signal Sig2 flows counterclockwise in the LC parallel resonator LC2 in a plan view from the positive direction side in the x-axis direction, a high-frequency signal Sig3 flows clockwise in the LC parallel resonator LC3 by the electromagnetic induction in a plan view from the positive direction side in the x-axis direction. Accordingly, the high-frequency signal Sig3 is output through the outer electrode 14b. Since the coil L1 is also electromagnetically coupled to the coil L3, the power of the high-frequency signals Sig1 and Sig3 is also affected by the electromagnetic coupling between the coils L1 and L3.

The LC parallel resonators LC1 to LC3 have specific resonant frequencies determined by the coils L1 to L3 and the capacitors C1 to C3, respectively. The impedances of the LC parallel resonators LC1 to LC3 are relatively high at the resonant frequencies. Accordingly, the high-frequency signal Sig3 within a predetermined frequency range determined by the resonant frequencies is output through the outer electrode 14b.

A non-limiting example of a method of manufacturing the electronic component 10 will now be described with reference to FIG. 1 and FIG. 2.

First, a ceramic green sheet to be used as the insulating layer 16 is prepared. Next, the via hole conductors b1 to b25 are formed on the ceramic green sheets to be used as the via hole conductors 16b to 16f. Specifically, the ceramic green sheets to be used as the insulating layers 16b to 16f are irradiated with a laser beam to form the via holes. Next, the via holes are filled with conductive paste made of, for example, Ag, Pd, Cu, Au, or an alloy of Ag, Pd, Cu, or Au by, for example, a printing application method.

Then, the conductive paste including, for example, Ag, Pd, Cu, Au, or an alloy of Ag, Pd, Cu, or Au as a main ingredient is applied on the ceramic green sheets to be used as the insulating layers 16b, 16c, 16f, and 16g by, for example, screen printing or photolithography to form the extended conductive layers 20a and 20b, the capacitor conductive layer 22a to 22c, the coil conductive layers 24a to 24c, the ground conductive layer 26, and the extended conductive layers 28a and 28b. The via holes may be filled with the conductive paste in the formation of the extended conductive layer 20a and 20b, the capacitor conductive layers 22a to 22c, and the coil conductive layers 24a to 24c.

Then, the ceramic green sheets are stacked on each other. Specifically, the ceramic green sheet to be used as the insulating layer 16g is arranged. Next, the ceramic green sheet to be used as the insulating layer 16f is arranged on the ceramic green sheet to be used as the insulating layer 16g. The ceramic green sheet to be used as the insulating layer 16f is then pressure-bonded on the ceramic green sheet to be used as the insulating layer 16g. The ceramic green sheets to be used as the insulating layers 16e, 16d, 16c, 16b, and 16a are stacked and pressure-bonded in the same manner in this order. The above process forms a mother multilayer body. The mother multilayer body is subjected to permanent pressure bonding by, for example, isostatic pressing.

Then, the mother multilayer body is cut into the multilayer body 12 of a certain size with a cutting blade. The multilayer body 12 that has not been fired is subjected to debinding and firing.

The above-described process produces the multilayer body 12 that has been fired. The multilayer body is subjected to barrel processing and is chamfered. Electrode paste including, for example, silver as the main ingredient is applied and baked on the front surface of the multilayer body 12 by a method, such as immersion, for example, to form a silver electrode to be used as the outer electrode 14.

Finally, the front surface of the silver electrode is plated with Ni or Sn, for example, to form the outer electrode 14. The electronic component 10 illustrated in FIG. 1 is manufactured through the non-limiting example of the process described above.

With the electronic component 10 having the above-described configuration, it is possible to adjust the degree of coupling between the coils L1 to L3 of the LC parallel resonators LC1 to LC3 without increasing the size of the electronic component. For example, in an electronic component including a band pass filter including a plurality of LC parallel resonators, there are cases in which the degree of coupling between the coils of the LC parallel resonators is preferably reduced in order to achieve desired characteristics. An exemplary method of reducing the degree of coupling between the coils of adjacent LC parallel resonators in the multilayer band pass filter described in International Publication No. 2007/119356 is to increase the distance between the LC parallel resonators. However, the increase in the distance between the LC parallel resonators causes a problem in that the size of the multilayer band pass filter is increased.

In contrast, in the electronic component 10, the loop plane S1 of the LC parallel resonator LC1 protrudes from the coil L2 of the LC parallel resonator LC2 at the positive direction side in the z-axis direction. In other words, the height of the LC parallel resonator LC2 in the z-axis direction is decreased to reduce the area in which the loop plane S1 of the LC parallel resonator LC1 opposes the loop plane S2 of the LC parallel resonator LC2 in the electronic component 10. As a result, the degree of coupling between the LC parallel resonator LC1 and the LC parallel resonator LC2 in the electronic component 10 is less than the degree of coupling between the LC parallel resonator LC1 and the LC parallel resonator LC2 in an electronic component in which the height of the loop plane S2 of the LC parallel resonator LC2 is equal or substantially equal to the height of the loop plane S1 of the LC parallel resonator LC1. The same applies to the degree of coupling between the LC parallel resonator LC2 and the LC parallel resonator LC3. As described above, in the electronic component 10, the degree of coupling between the LC parallel resonators LC1 to LC3 can be reduced without increasing the size of the electronic component.

In addition, in the electronic component 10, the conductive layers (the coil conductive layers 24a and 24c) provided at the side of the most positive direction in the z-axis direction of the LC parallel resonators LC1 and LC3, respectively, are provided on the front surface of the insulating layer 16b, which is provided at the positive direction side in the z-axis direction with respect to the conductive layer (the coil conductive layer 24b) provided at the side of the most positive direction in the z-axis direction of the LC parallel resonator LC2. In the configuration described above, the loop plane S1 of the LC parallel resonator LC1 and the loop plane S3 of the LC parallel resonator LC3 protrude from the loop plane S2 of the LC parallel resonator LC2 at the positive direction side in the z-axis direction, and the loop plane S1 of the LC parallel resonator LC1 opposes the loop plane S3 of the LC parallel resonator LC3. Accordingly, the degree of coupling between the coils L1 and L3 in the electronic component 10 is greater than the degree of coupling between the coils L1 and L3 in an electronic component in which the loop planes S1 and S3 do not protrude from the loop plane S2. Coupling the coils L1 and the L3 that are not adjacent to each other with the greater degree of coupling in the above manner allows the characteristics of the electronic component 10 to be adjusted to desired characteristics, as described below.

Furthermore, in the electronic component 10, the ground conductive layer 26 is used as the ground conductive layer for the capacitors C1 to C3. Accordingly, it is not necessary to provide the ground conductive layers 26 for the respective capacitors C1 to C3. The ground conductive layer 26 is provided at the side of the most negative direction in the z-axis direction of the LC parallel resonators LC1 to LC3. Accordingly, no via hole conductor is provided on the insulating layer 16g on which the ground conductive layer 26 is provided. Consequently, since it is not necessary for the ground conductive layer 26 to be arranged to avoid the via hole conductors, substantially the entire surface of the insulating layer 16g is covered with the ground conductive layer 26. As a result, external leakage of noise from the electronic component 10 and external entrance of noise into the electronic component 10 are prevented or minimized.

The electronic component 10 is not limited to the electronic component 10 according to the preferred embodiment described above and modifications of the electronic component 10 can be made within the spirit and scope of the present invention.

The electronic component 10 according to the preferred embodiment described above preferably includes the LC parallel resonators LC1 to LC3. However, the number of the LC parallel resonators included in the electronic component 10 is not limited thereto. FIGS. 4A to 4H are cross-sectional views illustrating electronic components 10a to 10h according to first to eighth modifications of a preferred embodiment of the present invention.

The electronic components 10a to 10h each include LC parallel resonators LC1 to LC5. In the electronic component 10a, the LC parallel resonators LC1 and LC5 protrude from the LC parallel resonators LC2 to LC4 at the positive direction side in the z-axis direction. Accordingly, the coil L1 of the LC parallel resonator LC1 is electromagnetically coupled to a coil L5 of the LC parallel resonator LC5. In the electronic component 10b, the LC parallel resonators LC1 and LC5 protrude from the LC parallel resonators LC2 to LC4 at the positive direction side and at the negative direction side in the z-axis direction. Accordingly, the coil L1 of the LC parallel resonator LC1 is electromagnetically coupled to the coil L5 of the LC parallel resonator LC5. As described above, the coils L1 and L5 of the two LC parallel resonators LC1 and LC5 between which the three LC parallel resonators LC2 to LC4 are sandwiched may be electromagnetically coupled to each other.

In the electronic component 10c, the LC parallel resonators LC1, LC3, and LC5 protrude from the LC parallel resonators LC2 and LC4 at the positive direction side in the z-axis direction. Accordingly, the coil L1 of the LC parallel resonator LC1 is electromagnetically coupled to the coil L3 of the LC parallel resonator LC3. Similarly, the coil L3 of the LC parallel resonator LC3 is electromagnetically coupled to the coil L5 of the LC parallel resonator LC5. In the electronic component 10d, the coils L1, L3, and L5 of the LC parallel resonators LC1, LC3, and LC5 protrude from the coils L2 and L4 of the LC parallel resonators LC2 and LC4 at the positive direction side and at the negative direction side in the z-axis direction. Accordingly, the coil L1 of the LC parallel resonator LC1 is electromagnetically coupled to the coil L3 of the LC parallel resonator LC3. Similarly, the coil L3 of the LC parallel resonator LC3 is electromagnetically coupled to the coil L5 of the LC parallel resonator LC5. As described above, the coils L1, L3, and L5 of the three LC parallel resonators LC1, LC3, and LC5 may be electromagnetically coupled to each other.

In the electronic component 10e, the LC parallel resonators LC2 and LC4 protrude from the LC parallel resonators LC1, LC3, and LC5 at the positive direction side in the z-axis direction. Accordingly, the coil L2 of the LC parallel resonator LC2 is electromagnetically coupled to the coil L4 of the LC parallel resonator LC4. In the electronic component 10f, the LC parallel resonators LC2 and LC4 protrude from the LC parallel resonators LC1, LC3, and LC5 at the positive direction side and at the negative direction side in the z-axis direction. Accordingly, the coil L2 of the LC parallel resonator LC2 is electromagnetically coupled to the coil L4 of the LC parallel resonator LC4. As described above, the coils L2 and L4 of the two LC parallel resonators LC2 and LC4, which are positioned at even-numbered stages, may be electromagnetically coupled to each other.

In the electronic component 10g, the LC parallel resonators LC1, LC2, LC4, and LC5 protrude from the LC parallel resonator LC3 at the positive direction side in the z-axis direction. Accordingly, the coil L2 of the LC parallel resonator LC2 is electromagnetically coupled to the coil L4 of the LC parallel resonator LC4. In the electronic component 10h, the LC parallel resonators LC1, LC2, LC4, and LC5 protrude from the LC parallel resonator LC3 at the positive direction side and at the negative direction side in the z-axis direction. Accordingly, the coil L2 of the LC parallel resonator LC2 is electromagnetically coupled to the coil L4 of the LC parallel resonator LC4. As described above, making only the LC parallel resonator LC3 shorter than the other LC parallel resonators, among the LC parallel resonators LC1 to LC5, may cause the coils L2 and L4 of the LC parallel resonators LC2 and LC4 to be electromagnetically coupled to each other.

The electronic component 10 preferably includes the three LC parallel resonators and the electronic components 10a to 10h each preferably include the five LC parallel resonators. However, the number of the LC parallel resonators is not limited thereto and it is sufficient for the electronic components to have a plurality of LC parallel resonators.

Coupling between LC parallel resonators that are not adjacent to each other will now be described with reference to the drawings. The inventor of the present application performed the following computer simulation in order to examine the variations in characteristics of the electronic component 10, which is caused by causing the LC parallel resonators that are not adjacent to each other to be opposed to each other to couple the LC parallel resonators to each other. Specifically, in the electronic component 10 including six LC parallel resonators LC1 to LC6, the LC parallel resonators to be opposed to each other were varied to examine the variations in transmission characteristic of a high-frequency signal.

Figure 5:
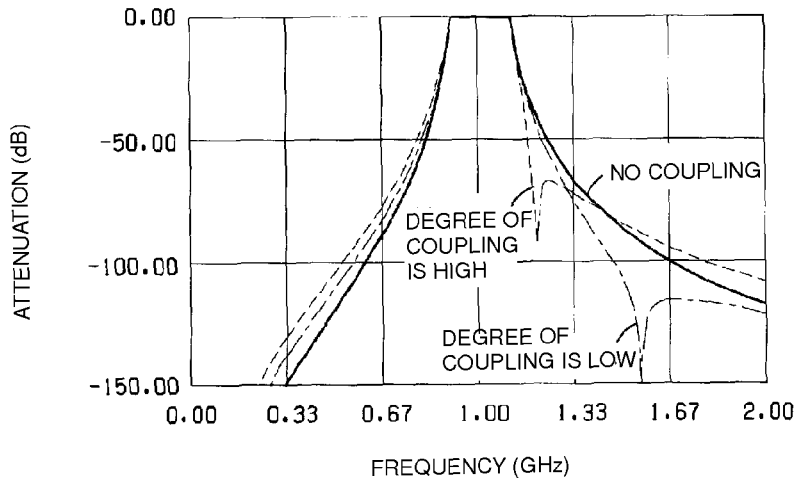
FIG. 5 is a graph illustrating a result of a first simulation.
Figure 6:
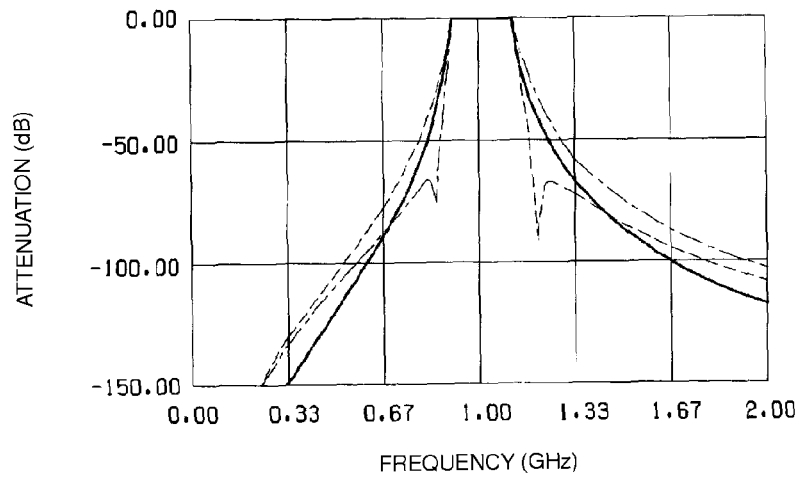
FIG. 6 is a graph illustrating a result of the first simulation.

In a first simulation, the transmission characteristic of the high-frequency signal was examined in the electronic component 10 in which the LC parallel resonator LC1 and the LC parallel resonator LC3 protrude from the LC parallel resonator LC2 (hereinafter referred to as a first model). FIG. 5 and FIG. 6 are graphs indicating the results of the first simulation. In FIG. 5 and FIG. 6, the vertical axis represents attenuation and the horizontal axis represents frequency.

As illustrated in FIG. 5, an attenuation pole is provided toward the high frequencies or toward the low frequencies of the pass band of the high-frequency signal in the first model. In FIG. 5, the attenuation pole is provided at the end toward the high frequencies of the pass band of the high-frequency signal. As illustrated in FIG. 5, it is possible to adjust the degree of coupling between the LC parallel resonators LC1 and LC3 in order to adjust the position of the attenuation pole.

Figure 7:
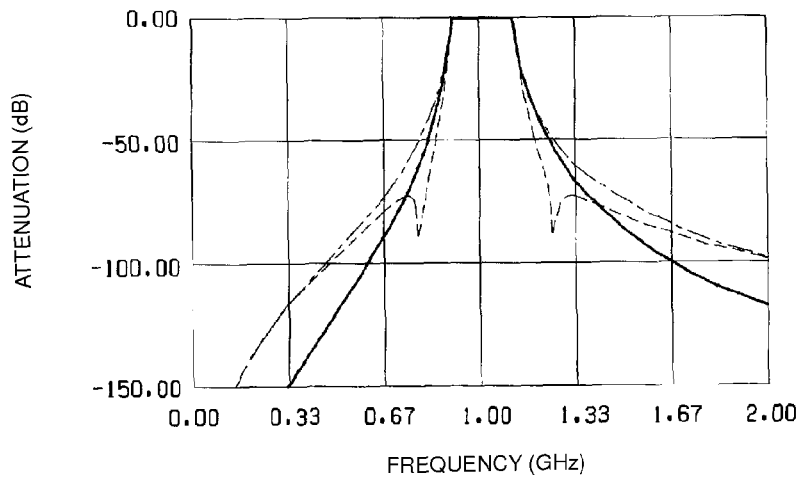
FIG. 7 is a graph illustrating a result of a second simulation.

In a second simulation, the transmission characteristic of the high-frequency signal was examined in the electronic component 10 in which the LC parallel resonator LC1 and the LC parallel resonator LC4 protrude from the LC parallel resonators LC2 and LC3 (a second model). FIG. 7 is a graph indicating the results of the second simulation. In FIG. 7, the vertical axis represents attenuation and the horizontal axis represents frequency.

As illustrated in FIG. 7, attenuation poles are provided both toward the high frequencies and toward the low frequencies of the pass band of the high-frequency signal in the second model. No attenuation pole may be provided depending on the characteristics of the LC parallel resonators LC1 to LC6. In this case, the attenuation is reduced in an area higher than the pass band of the electronic component 10 and in an area lower than the pass band of the electronic component 10.

Figure 8:
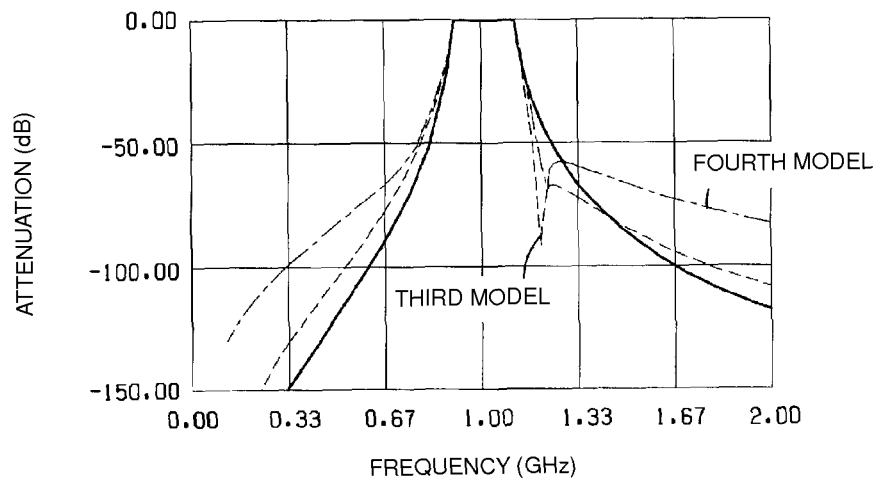
FIG. 8 is a graph illustrating a result of a third simulation.

In a third simulation, the transmission characteristics of the high-frequency signal were examined in the electronic component 10 in which the LC parallel resonator LC1 and the LC parallel resonator LC3 protrude from the LC parallel resonator LC2 (a third model) and in the electronic component 10 in which the LC parallel resonator LC1 and the LC parallel resonator LC5 protrude from the LC parallel resonators LC2 to LC4 (a fourth model). FIG. 8 is a graph indicating the results of the third simulation. In FIG. 8, the vertical axis represents attenuation and the horizontal axis represents frequency.

As illustrated in FIG. 8, the depth of the attenuation pole in the fourth model is lower than that in the third model. It is assumed that this is because the degree of coupling between the LC parallel resonators in the third model is lower than that in the fourth model.

Figure 9:
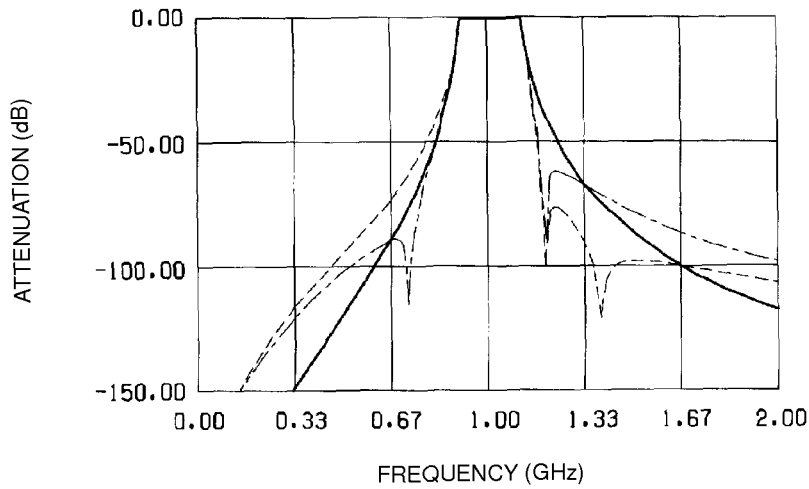
FIG. 9 is a graph illustrating a result of a fourth simulation.

In a fourth simulation, the transmission characteristic of the high-frequency signal was examined in the electronic component 10 in which the LC parallel resonator LC1 and the LC parallel resonator LC3 protrude from the LC parallel resonator LC2 and the LC parallel resonator LC3 and the LC parallel resonator LC5 protrude from the LC parallel resonator LC4 (a fifth model). FIG. 9 is a graph indicating the results of the fourth simulation. In FIG. 9, the vertical axis represents attenuation and the horizontal axis represents frequency.

As illustrated in FIG. 9, the LC parallel resonators are coupled to each other at two points to provide two attenuation poles in the fifth model. The two attenuation poles are provided both toward the high frequencies and toward the low frequencies of the pass band of the high-frequency signal or either toward the high frequencies or toward the low frequencies of the pass band of the high-frequency signal depending on the characteristics of the LC parallel resonators LC1 to LC6.

Figure 10:
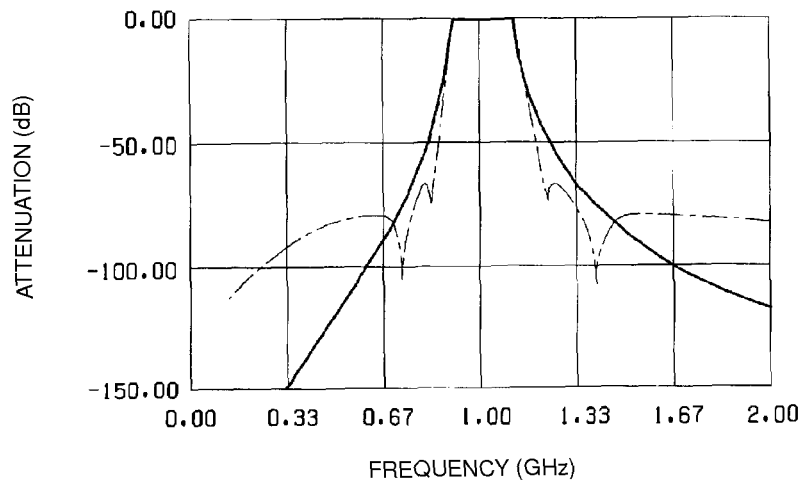
FIG. 10 is a graph illustrating a result of a fifth simulation.

In a fifth simulation, the transmission characteristic of the high-frequency signal was examined in the electronic component 10 in which the LC parallel resonator LC1 and the LC parallel resonator LC4 protrude from the LC parallel resonators LC2, LC3, LC5, and LC6 (a sixth model). FIG. 10 is a graph indicating the results of the fifth simulation. In FIG. 10, the vertical axis represents attenuation and the horizontal axis represents frequency.

As illustrated in FIG. 10, two attenuation poles are provided toward the high frequencies of the pass band and two attenuation poles are provided toward the low frequencies of the pass band in the sixth model.

As described above, preferred embodiments of the present invention are useful for electronic components. In particular, preferred embodiments of the present invention are excellent in that it is possible to adjust the degree of coupling between the LC parallel resonators without increasing the size of the electronic component.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   a multilayer body including a plurality of insulating layers that are stacked on each other; and
   a first LC parallel resonator, a second LC parallel resonator, and a third LC parallel resonator that each include via hole conductors extending in a stacking direction of the plurality of insulating layers and conductive layers provided on the respective plurality of insulating layers; and
   the first LC parallel resonator, the second LC parallel resonator, and the third LC parallel resonator each having a loop shape and collectively defining a band pass filter; wherein
   a first loop plane of the first LC parallel resonator, a second loop plane of the second LC parallel resonator, and a third loop plane of the third LC parallel resonator are parallel or substantially parallel to the stacking direction, are parallel or substantially parallel to each other, and are overlapped with each other at at least a portion of the first loop plane, the second loop plane, and the third loop plane in a plan view from a direction perpendicular or substantially perpendicular to the first loop plane;
   the first loop plane protrudes from the second loop plane at at least one of an upper portion and a lower portion of the stacking direction in the plan view from the direction perpendicular or substantially perpendicular to the first loop plane;
   the second loop plane is located between the first loop plane and the third loop plane;
   a first conductive layer provided at a top portion in the stacking direction of the first LC parallel resonator and a third conductive layer provided at a top portion in the stacking direction of the third LC parallel resonator are both provided on a first insulating layer that is provided at an upper portion in the stacking direction with respect to a second insulating layer on which a second conductive layer provided at a top portion in the stacking direction of the second LC parallel resonator is provided; and
   each of the first, second, and third conductive layers has an elongated rectangular shape such that each of the first loop plane, the second loop plane, and the third loop plane extends in the vertical stacking direction through all portions of the respective first, second, and third conductive layer.

2. The electronic component according to claim 1, wherein the first LC parallel resonator includes a coil and a capacitor;
   the capacitor includes:
     a ground conductive layer provided at a bottom portion in the stacking direction of the first LC parallel resonator; and
     a capacitor conductive layer opposing the ground conductive layer via another insulating layer; and
   the coil includes:
     a first coil via hole conductor connected to the capacitor conductor layer and extending in the stacking direction;
     a second coil via hole conductor connected to the ground conductive layer and extending in the stacking direction; and
     the first conductive layer connected to an upper end portion in the stacking direction of the first coil via hole conductor and an upper end portion in the stacking direction of the second coil via hole conductor.

3. The electronic component according to claim 2, wherein the ground conductive layer and the capacitor conductive layer include at least one of Ag, Pd, Cu, Au, or an alloy of Ag, Pd, Cu, or Au as a main ingredient.

4. The electronic component according to claim 1 wherein a fourth conductive layer provided at a first bottom portion in the stacking direction of the first LC parallel resonator, a fifth conductive layer provided at a second bottom portion in the stacking direction of the second LC parallel resonator, and a sixth conductive layer provided at a third bottom portion in the stacking direction of the third LC parallel resonator are provided on the same insulating layer.

5. The electronic component according to claim 1, wherein the fourth, fifth, and sixth conductive layers include at least one of Ag, Pd, Cu, Au, or an alloy of Ag, Pd, Cu, or Au as a main ingredient.

6. The electronic component according to claim 1, further comprising:
   outer electrodes disposed on at least one side surface of the multilayer body extending in the stacking direction; and
   extended conductive layers disposed on respective ones of the plurality of insulating layers and being connected to respective ones of the outer electrodes.

7. The electronic component according to claim 6, wherein each of the outer electrodes includes a silver layer.

8. The electronic component according to claim 7, wherein each of the outer electrodes includes a plated layer provided on the silver layer.

9. The electronic component according to claim 8, wherein the plated layer includes at least one of nickel or tin.

10. An electronic component comprising:
    a multilayer body including a plurality of insulating layers that are stacked on each other; and
    a first LC parallel resonator, a second LC parallel resonator, and a third LC parallel resonator that each include via hole conductors extending in a stacking direction of the plurality of insulating layers and conductive layers provided on the respective plurality of insulating layers; and
    the first LC parallel resonator, the second LC parallel resonator, and the third LC parallel resonator each have a loop shape; wherein
    a first loop plane of the first LC parallel resonator, a second loop plane of the second LC parallel resonator, and a third loop plane of the third LC parallel resonator are parallel or substantially parallel to each other, and are overlapped with each other at at least a portion of the first loop plane, the second loop plane, and the third loop plane in a plan view from a direction perpendicular or substantially perpendicular to the first loop plane; and
    the first loop plane protrudes from the second loop plane at at least one of an upper portion and a lower portion of the stacking direction in the plan view from the direction perpendicular or substantially perpendicular to the first loop plane;
    the second loop plane is located between the first loop plane and the third loop plane;
    a first conductive layer provided at a top portion in the stacking direction of the first LC parallel resonator and a third conductive layer provided at a top portion in the stacking direction of the third LC parallel resonator are both provided on a first insulating layer that is provided at an upper portion in the stacking direction with respect to a second insulating layer on which a second conductive layer provided at a top portion in the stacking direction of the second LC parallel resonator is provided; and
    each of the first, second, and third conductive layers respectively has an elongated rectangular shape, and each of the first loop plane, the second loop plane, and the third loop plane extends in the vertical stacking direction through all portions of the respective first, second, and third conductive layer.

11. The electronic component according to claim 10, wherein a fourth conductive layer provided at a first bottom portion in the stacking direction of the first LC parallel resonator, a fifth conductive layer provided at a second bottom portion in the stacking direction of the second LC parallel resonator, and a sixth conductive layer provided at a third bottom portion in the stacking direction of the third LC parallel resonator are provided on the same insulating layer.

12. The electronic component according to claim 10, wherein the first loop plane of the first LC parallel resonator and the second loop plane of the second LC parallel resonator are parallel or substantially parallel to the stacking direction.

13. The electronic component according to claim 11, wherein the fourth, fifth, and sixth conductive layers include at least one of Ag, Pd, Cu, Au, or an alloy of Ag, Pd, Cu, or Au as a main ingredient.

14. The electronic component according to claim 10, wherein the first loop plane, the second loop plane, and the third loop plane of the third LC parallel resonator are parallel or substantially parallel to the stacking direction.

15. The electronic component according to claim 10, wherein
the first LC parallel resonator includes a coil and a capacitor;
the capacitor includes:
a ground conductive layer provided at a bottom portion in the stacking direction of the first LC parallel resonator; and
a capacitor conductive layer opposing the ground conductive layer via another insulating layer; and
the coil includes:
a first coil via hole conductor connected to the capacitor conductor layer and extending in the stacking direction;
a second coil via hole conductor connected to the ground conductive layer and extending in the stacking direction; and
the first conductive layer connected to an upper end portion in the stacking direction of the first coil via hole conductor and an upper end portion in the stacking direction of the second coil via hole conductor.

16. The electronic component according to claim 15, wherein the ground conductive layer and the capacitor conductive layer include at least one of Ag, Pd, Cu, Au, or an alloy of Ag, Pd, Cu, or Au as a main ingredient.

17. The electronic component according to claim 10, further comprising:
outer electrodes disposed on at least one side surface of the multilayer body extending in the stacking direction; and
extended conductive layers disposed on respective ones of the plurality of insulating layers and being connected to respective ones of the outer electrodes.

18. The electronic component according to claim 17, wherein each of the outer electrodes includes a silver layer.

* * * * *